United States Patent [19]
Goo

[11] Patent Number: 5,477,072
[45] Date of Patent: Dec. 19, 1995

[54] NONVOLATILE SEMICONDUCTOR MEMORY DEVICE

[75] Inventor: Jung S. Goo, Soul, Rep. of Korea

[73] Assignee: Goldstar Electron Co., Ltd., Rep. of Korea

[21] Appl. No.: 340,796

[22] Filed: Nov. 16, 1994

Related U.S. Application Data

[63] Continuation of Ser. No. 153,878, Nov. 17, 1993, abandoned.

[51] Int. Cl.$^6$ .................................................. H01L 29/78
[52] U.S. Cl. ........................................... 257/316; 257/322
[58] Field of Search ..................................... 257/316, 318, 257/322, 315, 336, 344

[56] References Cited

U.S. PATENT DOCUMENTS

| | | | |
|---|---|---|---|
| 4,062,699 | 12/1977 | Armstrong | 148/1.5 |
| 4,142,926 | 3/1979 | Morgan | 148/187 |
| 4,173,818 | 11/1979 | Bassous et al. | 29/571 |
| 4,373,249 | 2/1983 | Kosa et al. | 29/571 |
| 4,376,947 | 3/1983 | Chiu et al. | 257/316 |
| 4,972,371 | 11/1990 | Komori et al. | 365/185 |
| 5,262,987 | 11/1993 | Kojima | 257/316 |
| 5,371,394 | 12/1994 | Ma et al. | 257/344 |
| 5,378,909 | 1/1995 | Chang et al. | 257/316 |

FOREIGN PATENT DOCUMENTS

| | | | |
|---|---|---|---|
| 62-71277 | 4/1987 | Japan | 257/316 |

*Primary Examiner*—Robert P. Limanek
*Attorney, Agent, or Firm*—Poms, Smith, Lande & Rose

[57] ABSTRACT

An EEPROM cell and a method for fabricating the same are disclosed.

The EEPROM cell fabricated by the method comprises of: a first active region with a second conductive low density impurity formed in a first conductive semiconductor substrate; a second active region with a second conductive high density impurity formed in one side of said first active region; a third active region with the second conductive high density impurity formed in the other side of said first active region; a fourth active region with a first conductive high density impurity formed so as to surround said third active region; a floating gate atop a first insulating layer overlying said first active region; and a control gate atop a second insulating layer overlying said floating gate.

The EEPROM cell is improved in an operational characteristic such as an erasing speed and a programming speed. The EEPROM cell is fabricated in such very small size to be integrated in a high integration degree.

The method for fabricating the EEPROM cell according to the invention is simpler than the conventional ones, whereby the EEPROM cell can be easily fabricated.

29 Claims, 4 Drawing Sheets

5,477,072

NONVOLATILE SEMICONDUCTOR MEMORY DEVICE

This is a continuation of application(s) Ser. No. 08/153,878 filed on Nov. 17, 1993, now abandoned.

BACKGROUND OF THE INVENTION

The present invention relates in generally to a nonvolatile semiconductor memory device and a method for fabricating the same, and more particularly to an electrically erasable and programmable read only memory (hereinafter "EEPROM") cell improved in programming operation and erasing operation and suitable for very large scale integration, along with a fabrication method for the same.

An EEPROM cell, which has a field effect transistor structure, is operated by use of a floating gate overlying an insulating layer atop the channel region which is formed between a source region and a drain region in a substrate, and a control gate overlying another insulating layer atop the floating gate.

Such EEPROMS have been used in limited fields, but as an interest in flash memory grows, its application fields have continued to expand.

Hereinafter, conventional EEPROM cell structures are to be briefly discussed with reference to several figures, along with problems accompanying these structures.

FIG. 1 shows one of the most conventional EEPROM cell structures. As shown in this figure, the EEPROM cell is structured to have a floating gate 4 between a substrate 1 and a control gate 6. The cell is considered to be programmed if the threshold voltage of the cell is increased as hot electrons are injected into the floating gate 4. On the other hand, the information is considered to be erased if the threshold voltage of the cell returns to its original state as the electrons are removed from the floating gate. The so-called "hot electron" means the free electron which is emitted from the metal plate of hot electron, when the metal plate is heated. The hot electrons are applied to a vacuum tube. In the meanwhile, carriers that are injected into a depletion layer are accelerated by a high field, and some of them may gain enough energy to cause impact ionization. These carriers have more energy than the thermal energy and are called "hot carriers".

In the EEPROM cell having the structure of FIG. 1, a high voltage is applied to a drain 2b to generate avalanche hot electrons. These avalanche hot electrons are injected into the floating gate 4, so that the cell is programmed. On the other hand, for the purpose of erasing the information, a high voltage is applied to a source 2a to emit the injected electrons from the floating gate through a thin tunneling oxide film.

Referring now to FIG. 2, another conventional EEPROM cell is shown. The EEPROM cell of FIG. 2 is structured so as not to include a tunneling oxide film which exists in FIG. 1. The programming and erasing operation is carried out in a manner similar to that for the cell structure of FIG. 1. This structure of EEPROM cell is used for flash memory.

In the aforementioned conventional cell structures, a high electric field has to be generated in the drain region 2a in order to improve a programming characteristic, whereas, for the better erasing characteristic, it is required to improve the junction breakdown characteristic so as not to generate junction breakdown when applying a high voltage to the source region 2b.

In an effort to improve those characteristics, an EEPROM cell structure has been disclosed in U.S. Pat. No. 4,972,371, which is schematically shown in a cross sectional view in FIG. 3. As illustrated in this drawing, there is formed a $p^+$ region 7 wherein impurities are doped in a high concentration beside a drain region 2b, in order to give rise to electric field, whereas there is formed an $n^-$ region wherein impurities ante doped in a low concentration beside a source region 2a, in order to improve the junction breakdown characteristic.

However, the EEPROM cell structure suggested in the aforementioned patent has disadvantages such as that the source and the drain are formed separately and differently, so that the fabrication method becomes complicated and even troublesome. For example, a photolithograph process is to be carried out in order to fabricate the EEPROM cell structure of FIG. 3, at least two times as many as for those of FIGS. 1 and 2.

SUMMARY OF THE INVENTION

Therefore, an object of the present invention is to solve the aforementioned problems encountered in the prior arts and to provide a nonvolatile semiconductor memory device, especially an EEPROM cell having improved in programming operation and erasing operation and a method for fabricating the same, whereby the transistor can be easily fabricated and used for very large scale integration.

According to one aspect of the present invention, this object can be accomplished by providing a nonvolatile semiconductor memory device, which comprises a first active region with a second conductive low density impurity formed in a first conductive semiconductor substrate; a second active region with a second conductive high density impurity formed in one side of said first active region; a third active region with the second conductive high density impurity formed in the other side of said first active region; a fourth active region with a first conductive high density impurity formed so as to surround said third active region; a floating gate atop a first insulating layer overlying said first active region; and a control gate atop a second insulating layer overlying said floating gate.

In accordance with another aspect of the present invention, the above object can be accomplished by providing a method for fabricating a transistor device, which comprises the steps of: implanting a second conductive impurity at a low density in a semiconductor substrate so as to form a first active region in a predetermined portion of said substrate; forming a first insulating layer, a first conductive layer, a second insulating layer and a second conductive layer over said first active region, in due order so as to form a stack structure; patterning said second conductive layer, said second insulating layer and said first conductive layer on a desired pattern to form a floating gate and a control gate; implanting a second conductive impurity at a high density to form a second active region and a third active region in substrate portions of both sides of said stack structure including said floating gate and said control gate, said stack structure serving as a mask; and implanting a first conductive impurity at a high density in only said third active region to form a fourth active region.

The above and other objects and advantages of the present invention will become more apparent as the following description proceeds.

To the accomplishment of the foregoing and related ends, the invention, then, comprises the features hereinafter fully described in the specification and particularly pointed out in claims, the following description and the annexed drawing setting forth in detail a certain illustrative embodiment of the invention, this being indicative, however, of but one of the various ways in which the principles of the invention may be employed.

DETAILED DESCRIPTION OF THE PREFERRED EMBODIMENTS

Figure 1:
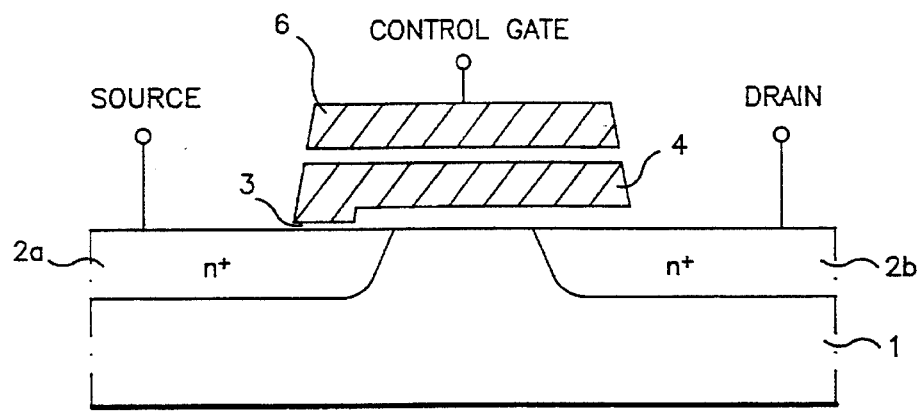
FIGS. 1 through 3 are schematic, cross sectional views showing conventional EEPROM cells.
Figure 2:
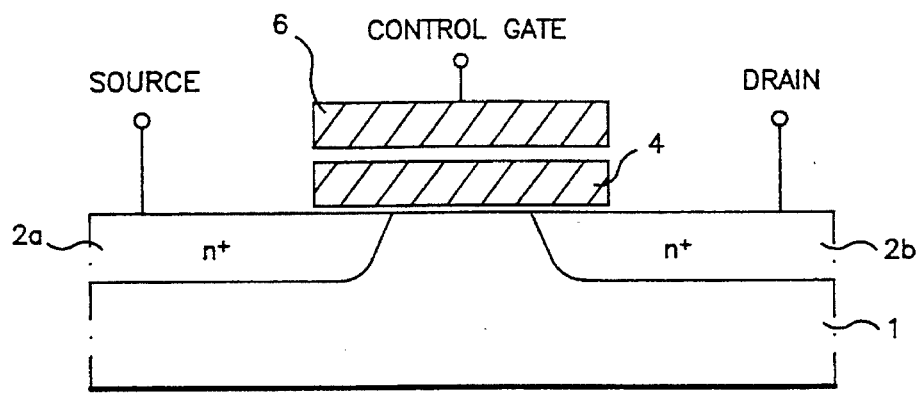
Figure 3:
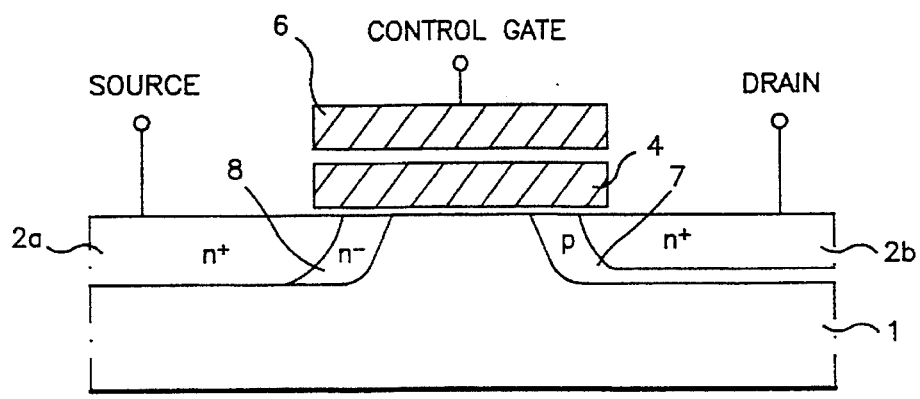

Hereinbefore, description for the preferred embodiments of the present invention will be given with reference to the accompanying drawings, wherein like reference numerals designate like parts.

Figure 4:
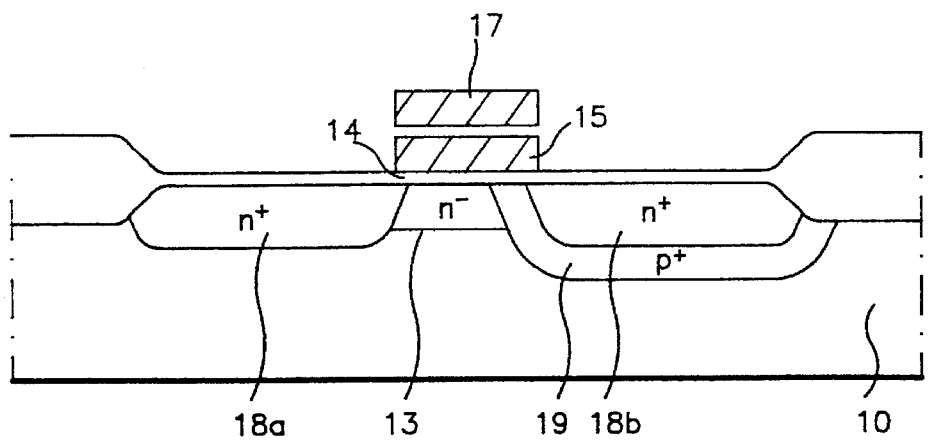
FIG. 4 is a schematic, cross sectional view showing an EEPROM cell according to a first embodiment of the present invention.

Referring initially to FIG. 4, there is illustrated an EEPROM cell structure according to a first embodiment of the present invention. As shown in this figure, the EEPROM cell according to the first embodiment of the present invention is structured to have a stack gate where a floating gate 15 is insulated by an interlayer 16 from a control gate 17, and a semiconductor substrate 10 sectioned into a device separation region and an active region where a first active region 13 of $n^-$ region is formed between a second active region 18a (source region) of $n^+$ region and a third active region 18b (drain region) of $n^+$ region surrounded by a fourth active region 19, the stack gate overlying the first active region 13 and being insulated from the substrate 10 by a first insulating layer 14.

In such EEPROM cell as having the above structure according to the present invention, the first active region 13 of low density $n^-$ region is formed to the side of the source 18a, so that the junction breakdown which may occur in erasing operation is improved. In addition, this inventive EEPROM cell is structured to maximize the overlap between the source-side junction regions 13 and 18a and the gate 17, resulting in enhancing the erasing operation speed. Furthermore, to the side of the drain 18b is formed a high density $p^+$ region 19 which allows a high electric field to be generated therein, so that the programming speed can increase step by step.

Referring now to FIG. 5, there is illustrated a method for fabricating a nonvolatile semiconductor memory device according to the first embodiment of the present invention.

Figure 5A:
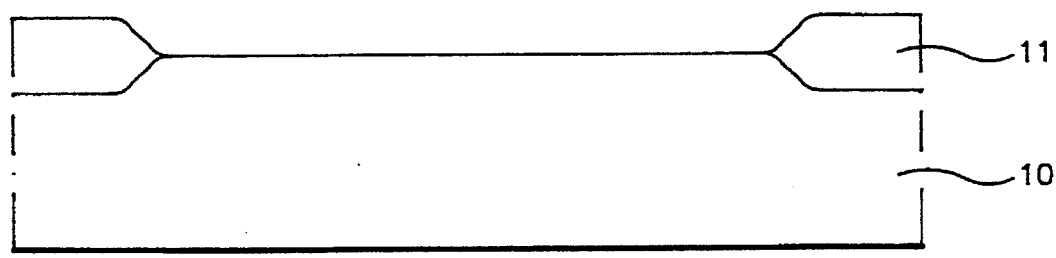
FIGS. 5A through 5E are schematic, cross sectional views showing the steps for fabricating the EEPROM cell according to the first embodiment of the present invention.

Over a first conductive semiconductor substrate 10 (e.g. $p^-$ type semiconductor substrate), a field oxide film 11 is formed so as to define a device separation region and an active region, using conventional local oxidation of silicon (LOCOS) process as a device separation process, as shown in FIG. 5A.

Figure 5B:
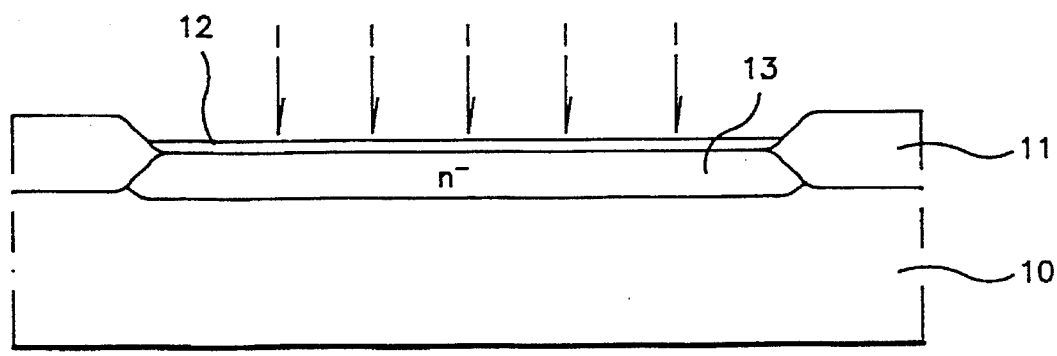

Subsequently, following the formation of sacrificial oxide film 12 on the surface of the semiconductor substrate 10, an n type impurity as a second conductive impurities are implanted at a low density to form a first active region 13 of $n^-$ region with a first junction depth, as shown in FIG. 5B.

Figure 5C:
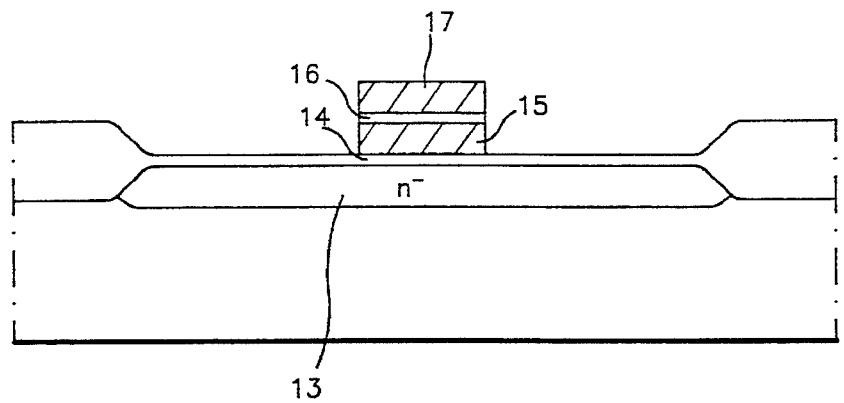

FIG. 5C shows the process to form a stack control gate structure. For thins, the sacrificial oxidation film 12 is removed and then, a first insulating layer 14 is formed on the first $n^-$ region 13. Over the first insulating layer 14, a first conductive layer 15, a second insulating layer 16 and a second conductive layer 17 are formed, in this order. A photolithograph process is applied to the second conductive layer 17, the second insulating layer 16 and the first conductive layer 15 to pattern them on a predetermined pattern. As a result of the patterning, a floating gate 15 and a control gate 17 are formed. The first and the second conductive layers for the gate are preferably formed of polysilicon.

Figure 5D:
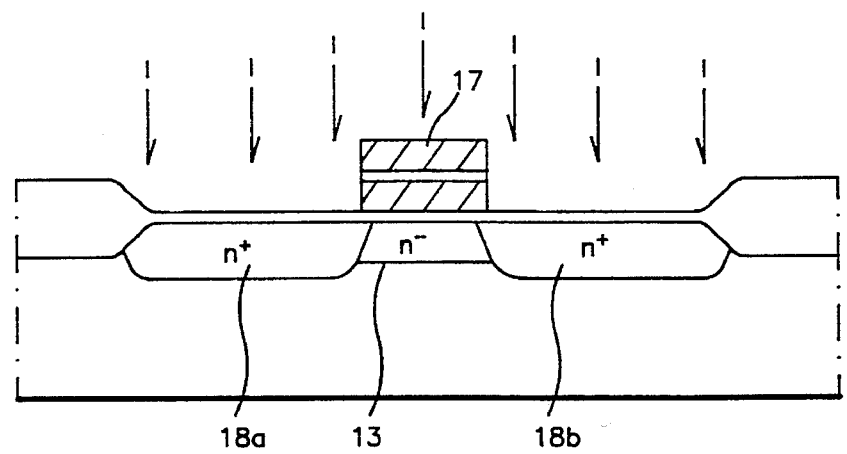

Next, an n-type impurity is ion-implanted at a high density by a self-alignment utilizing the stacked floating gate 15 and control gate 17 as a mask to form a second active region 18a and a third active region 18b in substrate portion of both sides of the gate, which are both an $n^+$ type and have a second junction depth, as shown in FIG. 5D. At this time, the first active region 13 remains below the gate region.

Figure 5E:
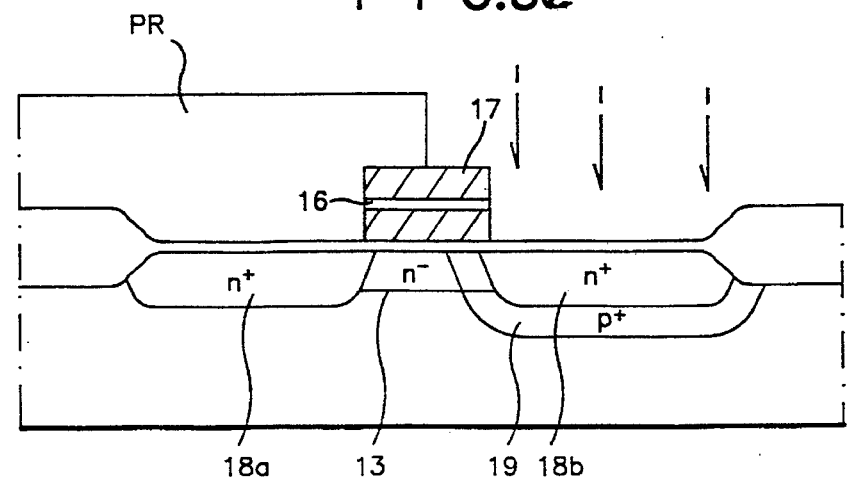

Finally, with reference to FIG. 5E, a photoresist (PR) is provided to mask a predetermined region, followed by the selective ion implantation of p-type impurity. As a first conductive impurity, the p-type impurity is implanted at a high concentration. As a result, there is formed a fourth active region 19 consisting of $p^+$ which surrounds the third active region 18b and has a third junction depth.

In accordance with the method of the preset invention,. the fourth active region 19 is formed so as to have a higher concentration than that of the first active region and lower then those of the first and the second active regions 18a and 18b. Also, the third junction depth, that is, the junction depth of the fourth active region is deeper than the first and the second junction depth, in accordance with the present invention.

As illuminated above, the source and drain region 18, $n^-$ region 13 of the source side and $p^+$ region 19 of the drain side can be formed by carrying out a single photolithograph process. Accordingly, EEPROM cells can be produced by a simpler process in accordance with the present invention. In addition, the present invention allows a very small sized device to be formed, so that the high integration for semiconductor memory device can be performed.

Figure 6:
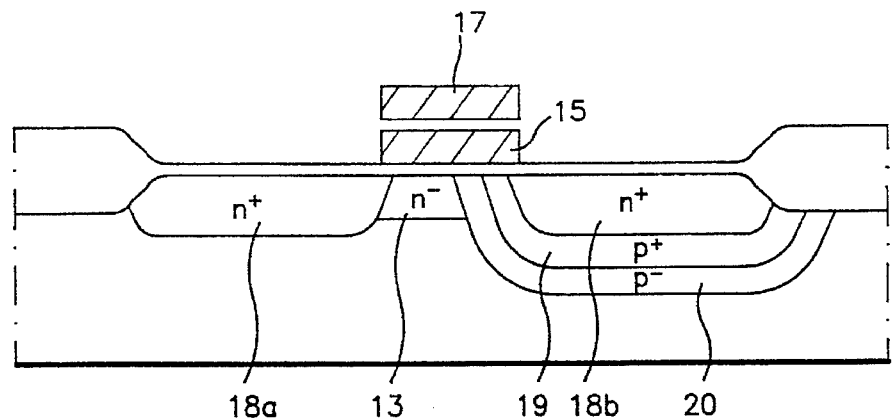
FIG. 6 is a schematic, cross sectional view showing an EEPROM cell according to a second embodiment of the present invention.

Turning now to FIG. 6, there is schematically shown an EEPROM cell structure according to a second embodiment of the present invention. As shown in FIG. 6, this EEPROM cell structure is provided with a fifth active region 20 consisting of $p^-$ ions so as to surround the fourth active region 19 in addition to the structure of the first embodiment.

In the structure according to the second embodiment of the present invention, the third active region 18b, that the drain region is so surrounded as to generate a high electric field for the improvement of programming speed, by the $p^+$ region 19 which is formed with higher concentration impurities than for the $p^-$ region 20 and is, in turn, surrounded by the $p^-$ region 20, so that the resulting p-type active regions utilized as a channel can be controlled not to have an overly high threshold voltage.

The EEPROM cell structure of the second embodiment is fabricated by implanting the p-type impurities under a suitable acceleration energy at a proper dose to form the fifth active region 20 consisting of p⁻ ions in such a way for the fifth active region to surround the fourth active region 19 consisting of p⁺ ions which has been already formed, as shown in FIG. 5e of the method for the EEPROM cell of the first embodiment.

Figure 7:
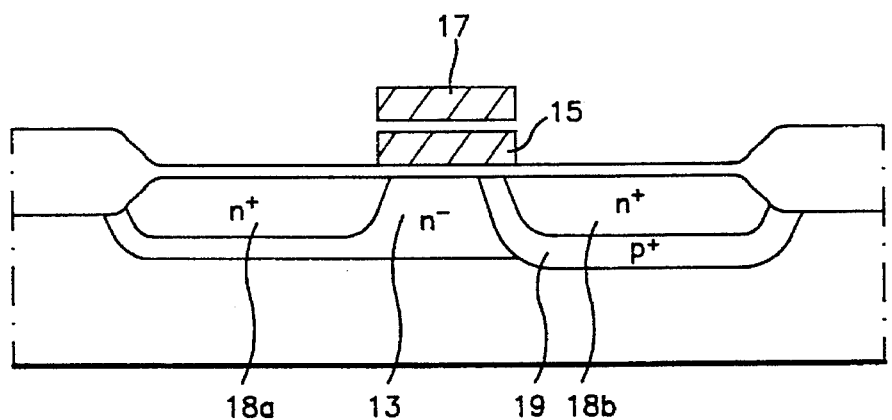
FIG. 7 is a schematic, cross sectional view showing an EEPROM cell according to a third embodiment of the present invention.

Now, an EEPROM cell structure according to a third embodiment of the present invention is to be described with reference to FIG. 7. As shown in this figure, the EEPROM cell structure according to the third embodiment is structured to comprise a first active region 13 which is deeper than the second and the third active regions 18a and 18b in contrast to the EEPROM cell structure according to the first embodiment. As a result, the first active region 13 consisting of n⁻ ions surrounds the second active region 18a, that is, the source region.

As fabricated in the EEPROM cell structure according to the third embodiment, the n⁻ region surrounding the n⁺ region plays a role in alleviating the electric field which is caused by the high voltage applied to the source when erasing the information. This alleviation is accomplished by inducing a part of the generated electric field into the substrate due to the n⁻ region.

The EEPROM cell structure according to the third embodiment of the present invention is fabricated in a manner similar to that of the first embodiment, except that the acceleration energies needed for implanting ion impurities are adjusted to form the first, the second and the third active regions 13, 18a and 18b in such a way that the first active region is deeper than the other regions.

Figure 8:
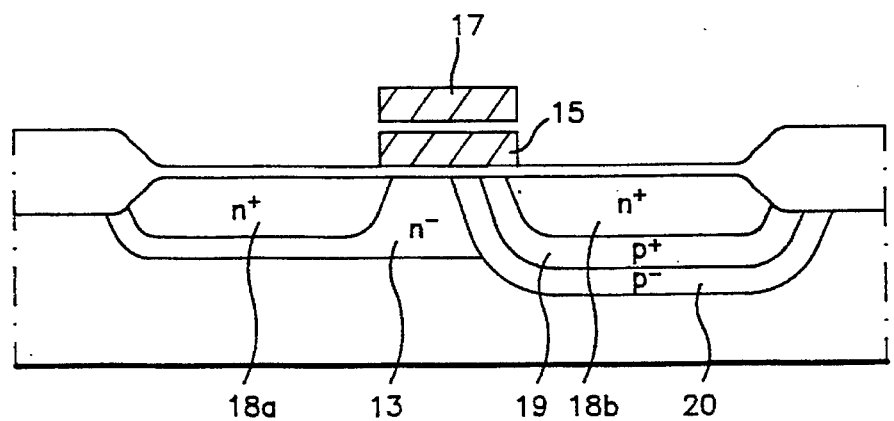
FIG. 8 is a schematic, cross sectional view showing an EEPROM cell according to a fourth embodiment of the present invention.

Description will be given next for an EEPROM cell structure according to a fourth embodiment of the present invention with reference to FIG. 8.

In this EEPROM cell, not only is formed the fifth active region 20 consisting of p⁻ ions which surrounds the fourth active region 19 consisting of p⁺ ions, as explained in the second embodiment, but also the first active region 13 consisting of n⁻ ions is formed in such a way to surround the second active region 18a consisting of n⁺ ions, as illustrated in the third embodiment. In other words, the EEPROM cell structure seen in FIG. 8 simultaneously employs the structures according to the second and the third embodiments of the present invention.

In the structure, the third active region 18b, that is, the drain region is surrounded by the p⁺ region 19 which is formed with impurities of higher concentration than that for the p⁻ region 20 and the p⁺ region 19 is, in turn, surrounded by the p⁺ region 20, so that the threshold voltage of the channel region can be controlled to be lowered. The fourth embodiment structure also comprises the first active region 13 consisting of n⁻ ions which surrounds the second active region 18a consisting of n⁺ ions and induces a part of the electric field which is caused by the high voltage applied to the source when erasing the information into the substrate, so that the generated electric field is alleviated due to the n⁻ region. Consequently, the EEPROM cell structure according to the fourth embodiment of the present invention shows improved programming and erasing operation.

The structure of the fourth embodiment is fabricated in a manner similar to that of the first embodiment except that the acceleration energies needed for implanting ion impurities are adjusted to form the first, the second and the third active regions 13, 18a and 18b in such a way that the first active region is deeper than the other regions and by implanting the p type impurities under a suitable acceleration energy at a proper dose to form the fifth active region 20 consisting of p⁻ ions in such a way for the fifth active region to surround the fourth active region 19 consisting of p⁺ ions which has been already formed as shown in FIG. 5E of the method for the EEPROM cell of the first embodiment.

As described hereinbefore, the EEPROM cells according to the second, the third and the fourth embodiments can be fabricated by the same process as the EEPROM cell according to the first embodiment is, so that an EEPROM cell with improved characteristics is easily produced. Further, an EEPROM cell improved in an operational characteristic such as an erasing speed and a programming speed is capable of being realized in accordance with the present invention. Moreover, the method according to the present invention allows an EEPROM cell fabricated thereby to be integrated in a high integration degree.

What is claimed is:

1. A nonvolatile semiconductor memory device, comprising:

a p-type semiconductor substrate;

a first active low-density n-type impurity region formed in said semiconductor substrate;

a second active high-density n-type impurity region formed at one side of said first active region;

a third active high-density n-type impurity region formed at an opposite side of said first active region;

a fourth active high-density p-type impurity region formed so as to surround said third active region and thereby isolate said first active region from said third active region;

a first insulating layer overlying said first active region;

a floating gate on top of said first insulating layer;

a second insulating layer overlying said floating gate; and a control gate on top of said second insulating layer.

2. The device of claim 1 wherein said first active region is formed by ion-implantation.

3. The device of claim 1 wherein said second active region functions as a source and said third active region functions as a drain.

4. The device of claim 1 further comprising a fifth active low-density p-type region surrounding said fourth active region, and wherein said first active region surrounds said second active region.

5. The device of claim 1 further comprising an n⁺/p⁺ drain side junction and an n⁻/p⁺ source side junction, both associated with said semiconductor substrate.

6. The device of claim 1 wherein said second and third active regions are deeper than said first active region.

7. The device of claim 1 wherein said first active region is deeper than said second and third active regions.

8. The device of claim 1 wherein said first active region surrounds said second active region.

9. The device of claim 1 further comprising a fifth active region surrounding said fourth active region.

10. The device of claim 9 wherein said fifth active region is a low-density p-type region.

11. The device of claim 1 wherein the impurity density of said fourth active region is higher than that of said first active region and lower than those of said second and third active regions.

12. The device of claim 1 wherein said fourth active region does not surround said second insulating layer.

13. The device of claim 1 wherein a block junction between a source region of said device and a drain region of said device is provided.

14. A nonvolatile semiconductor memory device, comprising:
   a p-type semiconductor substrate;
   a first active low-density n-type impurity region formed in said semiconductor substrate;
   a second active high-density n-type impurity region formed at one side of said first active region;
   a third active high-density n-type impurity region formed at an opposite side of said first active region;
   a fourth active high-density p-type impurity region formed so as to surround said third active region but not said second active region;
   a first insulating layer overlying said first active region;
   a floating gate on top of said first insulating layer;
   a second insulating layer overlying said floating gate; and
   a control gate on top of said second insulating layer.

15. The device of claim 14 wherein said first active region is formed by ion-implantation.

16. The device of claim 14 wherein said second active region functions as a source and said third active region functions as a drain.

17. The device of claim 14 further comprising a fifth active low-density p-type region surrounding said fourth active region, and wherein said first active region surrounds said second active region.

18. The device of claim 14 further comprising an $n^+/p^+$ drain side junction and an $n^-/p^+$ source side junction, both associated with said semiconductor substrate.

19. The device of claim 14 wherein said second and third active regions are deeper than said first active region.

20. The device of claim 14 wherein said first active region is deeper than said second and third active regions.

21. The device of claim 14 wherein said first active region surrounds said second active region.

22. The device of claim 14 further comprising a fifth active region surrounding said fourth active region.

23. The device of claim 22 wherein said fifth active region is a low-density p-type region.

24. The device of claim 14 wherein the impurity density of said fourth active region is higher than that of said first active region and lower than those of said second and third active regions.

25. The device of claim 14 wherein a block junction between a source region of said device and a drain region of said device is provided.

26. A nonvolatile semiconductor memory device, comprising:
   a p-type semiconductor substrate;
   a first active low-density n-type impurity region formed in said semiconductor substrate;
   a second active high-density n-type impurity region formed at one side of said first active region;
   a third active high-density n-type impurity region formed at an opposite side of said first active region;
   a fourth active high-density p-type impurity region formed so as to surround said third active region;
   a first insulating layer overlying said first active region;
   a floating gate on top of said first insulating layer;
   a second insulating layer overlying said floating gate;
   a control gate on top of said second insulating layer; and
   a fifth active low-density p-type region surrounding said fourth active region, and said first active region surrounds said second active region.

27. A nonvolatile semiconductor memory device, comprising:
   a p-type semiconductor substrate;
   a first active low-density n-type impurity region formed in said semiconductor substrate;
   a second active high-density n-type impurity region formed at one side of said first active region;
   a third active-high density n-type region formed at an opposite side of said first active region;
   wherein said first active region is deeper than said second and third active regions;
   a fourth active high-density p-type impurity region formed so as to surround said third active region;
   a first insulating layer overlying said first active region;
   a floating gate on top of said first insulating layer;
   a second insulating layer overlying said floating gate; and
   a control gate on top of said second insulating layer.

28. A nonvolatile semiconductor memory device, comprising:
   a p-type semiconductor substrate;
   a first active low-density n-type impurity region formed in said semiconductor substrate;
   a second active high-density n-type impurity region formed at one side of said first active region;
   wherein said first active region surrounds said second active region;
   a third active high-density n-type impurity region formed at an opposite side of said first active region;
   a fourth active high-density p-type impurity region formed so as to surround said third active region;
   a first insulating layer overlying said first active region;
   a floating gate on top of said first insulating layer;
   a second insulating layer overlying said floating gate; and
   a control gate on top of said second insulating layer.

29. A nonvolatile semiconductor device, comprising:
   a p-type semiconductor substrate;
   a first active low-density n-type impurity region formed in said semiconductor substrate;
   a second active high-density n-type impurity region formed at one side of said first active region;
   a third active high-density n-type impurity region formed at an opposite side of said first active region;
   a fourth active high-density p-type impurity region formed so as to surround said third active region;
   a first insulating layer overlying said first active region;
   a floating gate on top of said first insulating layer;
   a second insulating layer overlying said floating gate;
   a control gate on top of said second insulating layer; and
   a fifth active low-density p-type impurity region surrounding said fourth active region.

* * * * *